United States Patent [19]

Matsuda et al.

[11] 4,456,836

[45] Jun. 26, 1984

[54] GATE CIRCUIT FOR GATE TURN-OFF THYRISTOR

[75] Inventors: Yasuo Matsuda; Kazuo Honda; Hiroshi Fukui; Hisao Amano; Shuji Musha, all of Hitachi, Japan

[73] Assignee: Hitachi, Ltd., Tokyo, Japan

[21] Appl. No.: 335,547

[22] Filed: Dec. 29, 1981

[30] Foreign Application Priority Data

Dec. 29, 1980 [JP] Japan .................. 55-188646

[51] Int. Cl.³ .................................. H03K 17/72
[52] U.S. Cl. .................................. 307/252 C; 307/305
[58] Field of Search .......... 307/252 C, 252 J, 252 M, 307/305

[56] References Cited

U.S. PATENT DOCUMENTS

| 4,001,607 | 1/1977 | Dietz | 307/252 C |
| 4,115,707 | 9/1978 | Kalfus | 307/252 C |
| 4,117,350 | 9/1978 | Kalfus et al. | 307/252 C |

Primary Examiner—John Zazworsky
Attorney, Agent, or Firm—Antonelli, Terry & Wands

[57] ABSTRACT

A gate circuit for gate turn-off thyristors is disclosed which includes a turn-on circuit formed of a series combination of a turn-on power source and an NPN transistor and a turn-off circuit formed of a series combination of a turn-off power source and a thyristor, and in which a PNP transistor is provided between the anode and gate of the thyristor in such a manner that the base of the NPN transistor and the base of the PNP transistor are connected to each other and a junction of these bases receives a control signal for turning on or off a gate turn-off thyristor.

15 Claims, 4 Drawing Figures

GATE CIRCUIT FOR GATE TURN-OFF THYRISTOR

BACKGROUND OF THE INVENTION

The present invention relates to a gate circuit for a gate turn-off thyristor (hereinafter referred to as a "GTO"), and more particularly to a gate circuit in which power loss is extremely low.

Various gate circuits for GTO's have been published. A typical one of these gate circuits includes a turn-on circuit and a turn-off circuit each connected between the gate and cathode of a GTO. The turn-on circuit is formed of a series combination of a turn-on power source (namely, a power source for turning on the GTO) and a transistor, and the turn-off circuit is formed of a series combination of a turn-off power source (namely, a power source for turning off the GTO) and another transistor. When the GTO is turned on, the transistor in the turn-on circuit is made conductive, and the transistor in the turn-off circuit is made nonconductive. On the other hand, when the GTO is turned off, the transistor in the turn-on circuit is made nonconductive and the transistor in the turn-off circuit is made conductive.

Such a gate circuit causes no trouble when the anode current of the GTO is small. However, when the anode current of the GTO becomes large, it is required to cause a fairly large current to flow in order to turn off the GTO, since the turn-off gain of the GTO is small, that is, has a value of 3 to 5. Accordingly, the transistor in the turn-off current is required to have a large current capacity. A transistor having a large current capacity is expensive, and a gate circuit including such a transistor is uneconomical.

In order to solve this problem, for example, the following circuit arrangement is disclosed in U.S. Pat. No. 4,117,350, issued on Sept. 26, 1978. That is, the transistor in the turn-off circuit and a thyristor are connected in parallel, so that a major portion of an initial peak gate current flows through this thyristor and a predetermined limited portion of the gate current flows through the transistor in the turn-off circuit. By using such a circuit arrangement, the turn-off circuit can be formed of a transistor and a thyristor which are relatively inexpensive, and therefore an economical gate circuit can be formed.

Methods of supplying a turn-on signal and a turn-off signal to such a gate circuit have been provided. For example, one of the methods is disclosed in U.S. Pat. No. 4,115,707, issued Sept. 19, 1978. In this method, a turn-on signal is outputted from a control signal source, and a turn-off signal is formed by a one-shot circuit which is operated in response to the stoppage of the turn-on signal. However, in order to reduce power loss in the gate circuit, it is required to make a further appropriate improvement in the gate circuit.

SUMMARY OF THE INVENTION

An object of the present invention is to provide a gate circuit in which power loss is low. In order to attain the object, a gate circuit according to the present invention includes two concrete means, one of which is to use a thyristor as a main switching element in a turn-off circuit, to connect anode and gate terminals of the thyristor to emitter and collector terminals of a PNP transistor, respectively, and to connect a base terminal of the PNP transistor to a base terminal of an NPN transistor in a turn-on circuit. By using such a circuit arrangement, it is not required that a circuit for firing the above-mentioned thyristor includes a conventional differentiating circuit made up of a resistor and a capacitor, and further it is not required to use the one-shot circuit disclosed in the previously-referred U.S. patent. In other words, according to the present invention, power loss in the differentiating circuit and one-shot circuit can be avoided.

The other concrete means is to connect a diode between the base terminal of the NPN transistor in the turn-on circuit and an anode terminal of a GTO in such a manner that the forward direction of the diode is toward the anode terminal of the GTO. According to such a circuit arrangement, after the GTO has been turned on, a turn-on current flows into the anode side of the GTO through the diode, and the NPN transistor becomes nonconductive. Accordingly, a gate-on current for the GTO is stopped after a minimum period required, and thus a turn-on circuit which is low in power loss as compared with conventional turn-on circuits, can be obtained.

Further, the present invention including the above-mentioned concrete means has an advantage that a gate circuit can be made small in size and low in cost, and other advantages.

BRIEF DESCRIPTION OF THE DRAWINGS

FIG. 1b is a waveform chart showing the states of operation in various parts of the embodiment shown in FIG. 1a.

FIG. 2b is a waveform chart showing voltage waveforms and current waveforms in various parts of the embodiment shown in FIG. 2a.

DESCRIPTION OF THE PREFERRED EMBODIMENTS

Figure 1A:
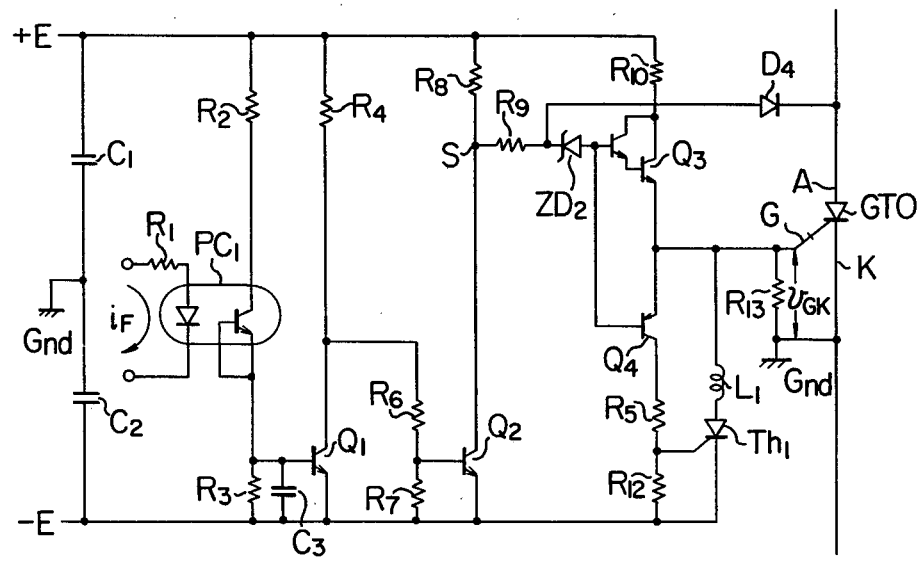
FIG. 1a is a circuit diagram showing an embodiment of the present invention.

Referring to FIG. 1a, a GTO has an anode terminal A, a cathode terminal K and a gate terminal G, and a turn-on circuit and a turn-off circuit are connected between the gate terminal G and cathode terminal K of the GTO. The turn-on circuit is formed of a series combination of a turn-on power source $C_1$, a resistor $R_{10}$ and an NPN transistor $Q_3$ (which can be formed as two transistors in a Darlington connection as shown in FIG. 1a), and the turn-off circuit is formed in such a manner that a series combination of an inductor $L_1$ and a thyristor $Th_1$ is connected in parallel with a series combination of a PNP transistor $Q_4$ and resistors $R_5$ and $R_{12}$, and the parallel combination thus obtained is connected in series with a turn-off power source $C_2$. Each of the power sources $C_1$ and $C_2$ has an earth electrode to be grounded, and the power sources $C_1$ and $C_2$ charge up to voltage levels $+E$ and $-E$, respectively. Needless to say, the negative electrode of the power source $C_1$ and the positive electrode of the power source $C_2$ may be connected directly to the cathode terminal of the GTO without being grounded. Further, between the positive electrode of the power source $C_1$ and the negative electrode of the power source $C_2$ are connected a series combination of a resistor $R_2$, a phototransistor of a photo-coupler $PC_1$ and a resistor $R_3$, a series combination of a resistor $R_4$ and a transistor $Q_1$, and a series combination of a resistor $R_8$ and a transistor $Q_2$. A control signal $i_F$ is supplied to a photodiode of the photo-coupler $PC_1$ through a resistor $R_1$. Further, the resistor $R_3$ and a capacitor $C_3$ are connected in parallel, and a junction of the phototransistor of the photo-coupler $PC_1$ and the resistor $R_3$ is connected to a base terminal of the transistor $Q_1$. A series combination of resistors $R_6$ and $R_7$ is connected between the collector and emitter of the transistor $Q_1$, and a junction of the resistors $R_6$ and $R_7$ is connected to a base terminal of the transistor $Q_2$. A junction S of the resistor 8 and a collector terminal of the transistor $Q_2$ is connected to path of a base terminal of the NPN transistor $Q_3$ (namely, the Darlington connection) and a base terminal of the PNP transistor $Q_4$ through a resistor $R_9$ and a zener diode $ZD_2$. In principle, the junction S may be considered a control signal input terminal. Further, a diode $D_4$ is connected between the anode terminal A of the GTO and a junction of the resistor $R_9$ and the zender diode $ZD_2$ in such a manner that the forward direction of the diode $D_4$ is toward the anode terminal A. The gate terminal G of the GTO is grounded (as indicated by reference symbol $G_{nd}$) through a resistor $R_{13}$.

The operation of the circuit shown in FIG. 1a is as follows. In the case where the GTO is turned on, the control signal $i_F$ taking a high level is supplied to the photodiode of the photo-coupler $PC_1$ at a time $t_1$ shown in FIG. 1b. Then, the photo-transistor of the photo-coupler $PC_1$ becomes conductive, and a current flows into the base of the transistor $Q_1$ through a path $C_1$-$R_2$-$PC_1$-$Q_1$. Thus, the transistor $Q_1$ becomes conductive, and the transistor $Q_2$ is made nonconductive. Accordingly, a current flows into the base of the transistor $Q_3$ through a path $C_1$-$R_8$-$R_9$-$ZD_2$-$Q_3$, and thus the transistor $Q_3$ becomes conductive. As a result, a gate-on current $i_G$ flows through a path $C_1$-$R_{10}$-$Q_3$-G-K-$G_{nd}$ to turn on the GTO. After the GTO has been turned on, the anode voltage thereof becomes less than a predetermined value at a time $t_2$. Then, the current having flowed into the base of the transistor $Q_3$ is caused to flow through a path $C_1$-$R_8$-$R_9$-$D_4$-A, and is not supplied to the transistor $Q_3$. As a result, the transistor $Q_3$ becomes nonconductive and the gate-on current does not flow. However, the GTO is kept in the ON-state. Briefly speaking, in the present invention, the gate-on current $i_G$ for turning on the GTO flows only for a period between times $t_1$ and $t_2$ which is a minimum period required for turning it on, and therefore power dissipation in the gate circuit can be reduced. A zener voltage of the zener diode $ZD_2$ is so selected as to be greater than the sum of a voltage drop across the diode $D_4$ and a voltage drop between the anode and cathode terminals of the GTO. Thus, the current having flowed into the base of the transistor $Q_3$ can be rapidly forced to flow into the anode terminal A of the GTO through the diode $D_4$ when the GTO has been turned on. Further, when the GTO is turned off, a reverse base current to the transistor $Q_3$ can flow smoothly. It is a matter of course that the zener diode $ZD_2$ may be replaced by a combination of ordinary diodes, but it is preferred to use a single zener diode in order to simplify the gate circuit.

Next, explanation will be made on the case where the GTO is turned off. The control signal $i_F$ taking a low level is supplied to the photodiode of the photo-coupler $PC_1$ at a time $t_3$ shown in FIG. 1b. Then, the phototransistor of the photo-coupler $PC_1$ becomes nonconductive. Accordingly, no current flows into the base of the transistor $Q_1$, and therefore the transistor $Q_1$ becomes non-conductive. In this case, however, a current flows into the base of the transistor $Q_2$ through a path $C_1$-$R_4$-$R_6$-$Q_2$, and the transistor $Q_2$ is thereby made conductive. Then, the gate-off current $i_G$ flows through a path $G_{nd}$-K-G-$Q_3$-$ZD_2$-$R_9$-$Q_2$-$C_2$ and through a path $G_{nd}$-K-G-$Q_4$-$ZD_2$-$R_9$-$Q_2$-$C_2$. Thus, at a time $t_4$, the transistor $Q_4$ is made conductive but the transistor $Q_3$ is kept nonconductive. When the transistor $Q_4$ becomes conductive, the gate-off current $i_G$ flows into the gate of the thyristor $Th_1$ through a path $G_{nd}$-K-G-$Q_4$-$R_5$-$Th_1$-$C_2$, and the thyristor $Th_1$ is thereby made conductive. Accordingly, in the present invention, it is not required to include such a special circuit as the one-shot circuit disclosed in the previously-referred U.S. patent. Thereafter, the gate-off current $i_G$ flows through a path $G_{nd}$-K-G-$L_1$-$Th_1$-$C_2$, and the GTO is turned off at a time $t_5$. Then, the gate-off current $i_G$ becomes zero, and the thyristor $Th_1$ is turned off naturally. However, throughout a period when the transistor $Q_2$ is kept conductive, the transistor $Q_4$ takes the conductive state and a reverse bias voltage is applied between the gate terminal G and cathode terminal K of the GTO through a path K-$G_{nd}$-$C_2$-$R_{12}$-$R_5$-$Q_4$-G. As mentioned above, the transistor $Q_4$ has a function of making the thyristor $Th_1$ conductive and a function of improving the dv/dt capability of the GTO.

Figure 1B:
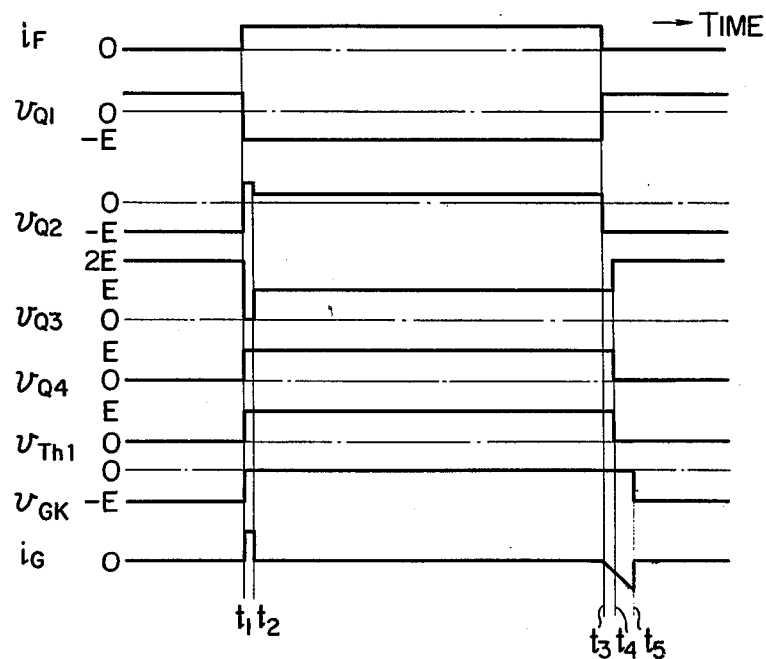

Incidentally, in FIG. 1b, reference symbol $v_{Q1}$ designates a collector potential of the transistor $Q_1$, $v_{Q2}$ a collector potential of the transistor $Q_2$, $v_{Q3}$ a voltage between the collector and base of the transistor $Q_3$, $v_{Q4}$ a voltage between the collector and base of the transistor $Q_4$, $v_{Th1}$ a voltage between the anode and cathode of the thyristor $Th_1$, and $v_{GK}$ a voltage between the gate and cathode of the GTO.

Figure 2A:
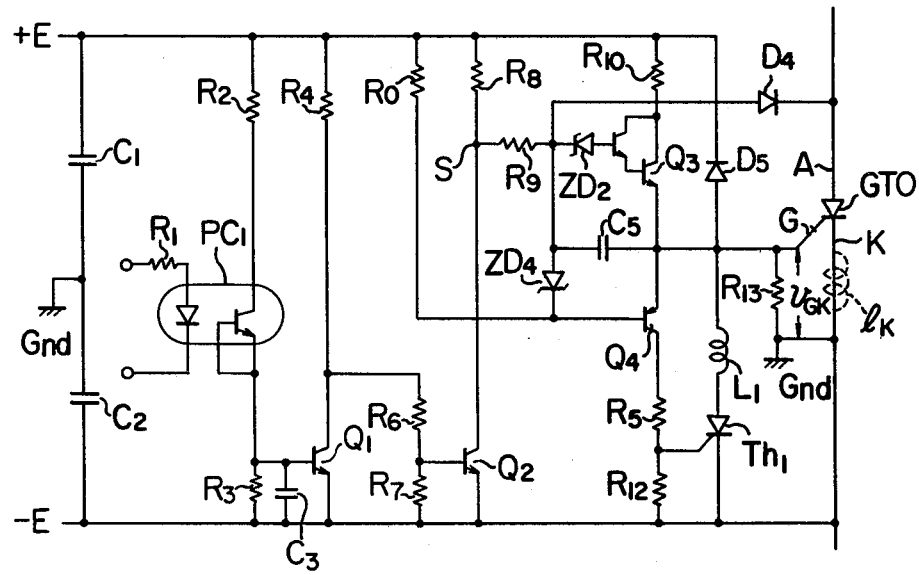
FIG. 2a is a circuit diagram showing another embodiment of the present invention.
Figure 2B:
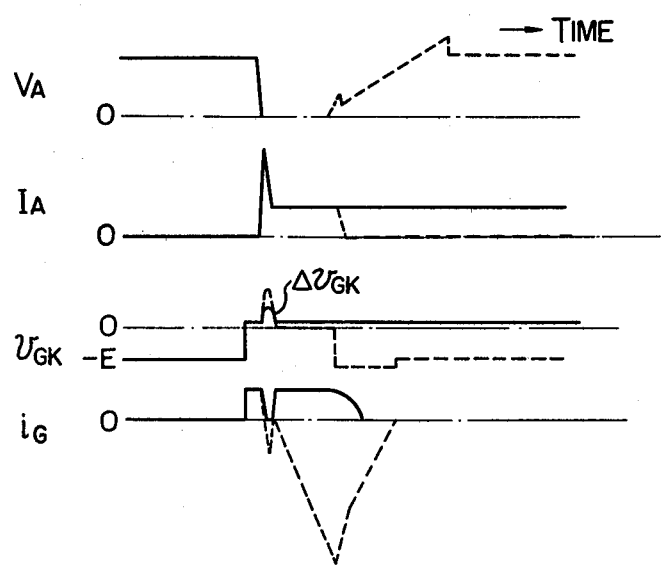

FIG. 2a shows another embodiment of a gate circuit according to the present invention, which is a modified version of the embodiment shown in FIG. 1a. In FIG. 2b which shows voltage and current waveforms in various parts of the embodiment shown in FIG. 2a, reference symbol $V_A$ designates an anode voltage of a GTO, $I_A$ an anode current of the GTO, $v_{GK}$ a voltage between the gate and cathode of the GTO, and $i_G$ a gate current. In this embodiment, a gate-on current flows through the same path as the embodiment shown in FIG. 1a, while a base current of the transistor $Q_4$ flows through a path $G_{nd}$-K-G-$Q_4$-$ZD_4$-$R_9$-$Q_2$-$C_2$. In the case where the current increase rate in turning on a GTO is very high as in a PWM (pulse width modulation) inverter, if a very small inductance $l_K$ of the order of tens of nanohenries such as indicated by a dotted line in FIG. 2a is present between the cathode of the GTO and an earth terminal $G_{nd}$, a transient voltage $\Delta v_{GK}$ is generated between the gate terminal G and cathode terminal K of the GTO, as shown in FIG. 2b. In some cases, this transient voltage $\Delta v_{GK}$ causes a false extingushing operation for the GTO if the circuit arrangement shown in FIG. 1a is employed as it is. That is, when the voltage $\Delta v_{GK}$ caused by the inductance $l_K$ at a turn-on time of the GTO becomes higher than the voltage E of the turn-on power source $C_1$, the transistor $Q_3$ having supplied a turn-on pulse is turned off, and further the transistor $Q_4$ is driven to trigger the turn-off thyristor $Th_1$. Thus, immediately after having been turned on, the GTO is erroneously turned off. FIG. 2b shows voltage and current waveforms before and after the GTO is turned on. In FIG. 2b, solid lines indicate a normal operation, and dotted lines an erroneous operation. When the erroneous operation as described above is generated, an abnormal operation is performed in a main circuit such as an inverter, and additionally a power-source shorting current flows through a path $C_1$-$R_{10}$-$Q_3$-$L_1$-$Th_1$-$C_2$ in the gate circuit, thereby burning out the gate circuit. The circuit shown in FIG. 2a includes additional circuit elements for preventing such an erroneous operation. That is, a diode $D_5$ shown in FIG. 2a is a fundamental means for solving the above problem, and the transient voltage $\Delta v_{GK}$ is clamped by the diode $D_5$ so as not to exceed the supply voltage E. In some cases, however, the addition of only the diode $D_5$ is not sufficient to clamp the transient voltage $\Delta v_{GK}$, i.e. to bypass a transient reverse current due to the transient voltage. This is due to the fact that a transient recovery time is present with respect to the transient voltage in the forward characteristic of the diode $D_4$. Namely, it takes a short time for the diode to sufficiently bypass the transient reverse current to the forward direction thereof. Therefore, the voltage $\Delta v_{GK}$ becomes higher than the supply voltage E by a small amount only for a very short period before the transient recovery time has lapsed. A zener diode $ZD_4$ provides an operational margin for eliminating the above-mentioned difficulty caused by the recovery time. Namely, a resistor $R_0$ is further provided to make a current path $C_1$-$R_0$-$ZD_4$-$ZD_2$-$Q_3$-G-K-$G_{nd}$ for charging the injection capacity of the zener diode $ZD_4$ previously before the turn-on of the GTO, to thereby block the transient recovery voltage during the transient recovery time of the diode $D_5$ and prevent the turn-off of the transistor $Q_3$.

Further, a capacitor $C_5$ forms a bypass for the transient reverse current appearing only for the above-mentioned very short period, and prevents the transient reverse current from flowing through the base of the transistor $Q_4$. According to the circuit shown in FIG. 2a, even when the inductance $l_K$ is present at a cathode portion of the GTO, a stable, reliable operation of the GTO is obtained. However, all of the additional elements shown in FIG. 2a such as the diode $D_5$, capacitor $C_5$, zener diode $ZD_4$ and register $R_0$ are not required, but these additional elements may be adopted or rejected as required.

We claim:

1. A gate circuit provided with a turn-on circuit and a turn-off circuit each connected between gate and cathode terminals of a gate turn-off thyristor, said turn-on circuit including a series combination of a turn-on power source and a first NPN transistor, said turn-off circuit including a series combination of a turn-off power source and a thyristor, said gate circuit comprising:
a signal input terminal connected to a base terminal of said first NPN transistor for supplying a control signal to said base terminal of said first NPN transistor; and
a PNP transistor connected between anode and gate terminals of said thyristor, emitter and collector terminals of said PNP transistor being connected to said anode and gate terminals of said thyristor, respectively, a base terminal of said PNP transistor being connected to said base terminal of said first NPN transistor.

2. A gate circuit according to claim 1, wherein said base terminal of said first NPN transistor is connected to said signal input terminal through a first zener diode whose forward direction is toward said signal input terminal.

3. A gate circuit according to claim 2, wherein a first diode is connected between a cathode terminal of said first zener diode and an anode terminal of said gate turn-off thyristor in such a manner that the forward direction of said first diode is toward said anode terminal of said gate turn-off thyristor.

4. A gate circuit according to claim 1, 2 or 3, wherein said gate turn-on circuit further comprises a second NPN transistor coupled to an emitter of said first NPN transistor to form a Darlington connection.

5. A gate circuit provided with a turn-on circuit and a turn-off circuit each connected between gate and cathode terminals of a gate turn-off thyristor, said turn-on circuit including a series combination of a turn-on power source and a first NPN transistor, said turn-off circuit including a series combination of a turn-off power source and a thyristor, said gate circuit comprising:
a signal input terminal for supplying a control signal to a base terminal of said first NPN transistor;
a first zener diode connected between said base terminal of said first NPN transistor and said signal input terminal, the forward direction of said first zener diode being toward said signal input terminal; and
a PNP transistor connected between anode and gate terminals of said thyristor, emitter and collector terminals of said PNP transistor being connected to said anode and gate terminals of said thyristor, respectively, a base terminal of said PNP transistor being connected to a anode terminal of said first zener diode.

6. A gate circuit according to claim 5, wherein a first diode is connected between said cathode terminal of said first zener diode and said anode terminal of said gate turn-off thyristor in such a manner that the forward direction of said first diode is toward said anode terminal of said gate turn-off thyristor.

7. A gate circuit according to claim 5 or 6, wherein a second diode is connected between said gate terminal of said gate turn-off thyristor and a positive electrode terminal of said turn-on power source in such a manner that the forward direction of said second diode is toward said positive electrode terminal.

8. A gate circuit according to claim 5 or 6, wherein a second zener diode is connected between said cathode terminal of said first zener diode and said base terminal of said PNP transistor in such a manner that the forward direction of said second zener diode is toward said base terminal of said PNP transistor.

9. A gate circuit according to claim 8, wherein a resistor is connected between said base terminal of said PNP transistor and a positive electrode terminal of said turn-on power source.

10. A gate circuit according to claim 5 or 6, wherein a capacitor is connected between said base and emitter terminals of said PNP transistor.

11. A gate circuit according to claim 8, wherein a capacitor is connected between said emitter terminal of said PNP transistor and an anode terminal of said second zener diode.

12. A gate circuit according to claim 5 or 6, wherein said gate turn-on circuit further comprises a second NPN transistor coupled to an emitter of said first NPN transistor to form a Darlington connection.

13. A gate circuit according to claim 1, 2, 3, 5 or 6, wherein a resistor is connected between a positive electrode terminal of said turn-on power source and said signal input terminal, a switching element is connected between said signal input terminal and a negative electrode terminal of said turn-off power source, and said control signal is generated on the basis of an on-off action of said switching element.

14. A turn-on circuit connected between gate and cathode terminals of a gate turn-off thyristor and including a series combination of a turn-on power source and a first NPN transistor, said turn-on circuit comprising:
- a signal input terminal for supplying a control signal to a base terminal of said first NPN transistor;
- a first zener diode connected between said base terminal of said first NPN transistor and said signal input terminal, the forward direction of said first zener diode being toward said signal input terminal; and
- a first diode connected between a cathode terminal of said first zener diode and an anode terminal of said gate turn-off thyristor, the forward direction of said first diode being toward said anode terminal of said gate turn-off thyristor.

15. A turn-on circuit according to claim 14, further comprising a second NPN transistor coupled to an emitter of said first NPN transistor to form a Darlington connection.

* * * * *